(12) United States Patent
Kinsman et al.

(10) Patent No.: US 6,534,339 B2
(45) Date of Patent: Mar. 18, 2003

(54) SEMICONDUCTOR DEVICE COMPRISING A SOCKET AND METHOD FOR FORMING SAME

(76) Inventors: Larry Kinsman, 29 Burnett Ln. HC 33 Box 2461, Boise, ID (US) 83716; Salman Akram, 1463 E Regatta St., Boise, ID (US) 83706

( * ) Notice: Subject to any disclaimer, the term of this patent is extended or adjusted under 35 U.S.C. 154(b) by 0 days.

(21) Appl. No.: 09/989,576

(22) Filed: Nov. 20, 2001

(65) Prior Publication Data

US 2002/0031858 A1 Mar. 14, 2002

Related U.S. Application Data

(62) Division of application No. 09/145,382, filed on Sep. 1, 1998, now Pat. No. 6,320,253.

(51) Int. Cl.⁷ .............................. H01L 21/44
(52) U.S. Cl. .................. 438/107; 438/117; 438/121
(58) Field of Search ........................... 438/107, 106, 438/117, 118, 121; 361/728, 736, 748, 769, 787

(56) References Cited

U.S. PATENT DOCUMENTS

| | | | |
|---|---|---|---|
| 4,992,849 A | 2/1991 | Corbett et al. ............. 357/72 |
| 4,992,850 A | 2/1991 | Corbett et al. ............. 357/72 |
| 5,104,324 A | 4/1992 | Grabbe et al. ............. 439/62 |
| 5,138,434 A | 8/1992 | Wood et al. ............... 357/74 |
| 5,266,912 A | 11/1993 | Kledzik ................. 333/247 |
| 5,281,852 A | 1/1994 | Normington ............. 257/685 |
| 5,343,366 A | 8/1994 | Cipolla et al. ............ 361/785 |
| 5,593,927 A | 1/1997 | Farnworth et al. ........ 437/209 |
| 5,793,116 A | 8/1998 | Rinne et al. ............. 257/777 |
| 5,892,287 A | 4/1999 | Hoffman et al. .......... 257/777 |
| 5,940,277 A * | 8/1999 | Farnworth et al. ........ 361/760 |
| 5,943,213 A | 8/1999 | Sasov .................. 361/705 |
| 5,956,236 A | 9/1999 | Corisis et al. ........... 361/783 |
| 5,990,566 A | 11/1999 | Farnworth et al. ........ 257/783 |
| 6,107,122 A * | 8/2000 | Wood et al. ............. 438/117 |

* cited by examiner

*Primary Examiner*—Michael Sherry
*Assistant Examiner*—Scott B. Geyer

(57) ABSTRACT

An electronic device such as a semiconductor module comprises a printed circuit board and a socket attached to the printed circuit board and in electrical communication therewith. The socket comprises a plurality of electrically-conductive surfaces. The device further comprises a plurality of die and a plurality of supports each attached to the socket. At least one die is mechanically connected with each support, and each die has a plurality of electrically-conductive pads thereon. The plurality of electrically-conductive pads contact the electrically-conductive surfaces of the socket. A method for forming the electronic device is also described.

32 Claims, 3 Drawing Sheets

SEMICONDUCTOR DEVICE COMPRISING A SOCKET AND METHOD FOR FORMING SAME

This application is a division of application Ser. No. 09/145,382, filed Sep. 1, 1998, now U.S. Pat. No. 6,320,253.

FIELD OF THE INVENTION

This invention relates to the field of semiconductor assembly, and more particularly to a semiconductor device comprising a socket and at least one wafer section, and the method of forming the semiconductor device.

BACKGROUND OF THE INVENTION

A semiconductor device in its most common form comprises a semiconductor die having bond pads thereon, a lead frame mechanically connected with the die, bond wires which electrically couple the bond pads with lead fingers of the lead frame, and encapsulation material which surrounds the die, the bond wires, and the majority of the lead frame. The device, generally, is electrically coupled with a printed circuit board (PCB) by soldering leads of the lead frame with pads on the PCB.

One problem associated with a conventionally packaged die is that the package requires a large space on the PCB which makes it difficult to densely mount a plurality of packaged die on the PCB in a small area. Another problem is that if a semiconductor device malfunctions it can be difficult to desolder and replace the device. Further, packaging the die as described above is expensive as the wire bonding and encapsulation of the die requires expensive equipment and a large space to house and use the equipment.

Nonconventional semiconductor devices include those described in the following US patents, each of which is assigned to Micron Technology, Inc. and incorporated herein by reference: U.S. Pat. No. 5,593,927 issued Jan. 14, 1997 to Farnworth, et al.; U.S. Pat. No. 5,266,912 issued Nov. 30, 1993 to Kledzik; U.S. Pat. No. 5,138,434 issued Aug. 11, 1992 to Wood, et al.; U.S. Pat. Nos. 4,992,849 and 4,992,850 each issued Feb. 12, 1991 to Corbett et al.

U.S. Pat. No. 5,104,324 issued Apr. 14, 1992 to Grabbe et al. describes a socket-like connector for receiving a semiconductor device. Electrical contact between the semiconductor device and the socket is made through a conductive cantilevered spring arm which contacts the semiconductor device. As the device is inserted into the socket the spring arm slides across a contact pad and electrical coupling is established.

Various problems can result from insertion of a semiconductor device into a socket. For example, the edge of the semiconductor device can crack due to forces of the arm to which contact is to be made. Further, the contact pad can be damaged as the spring arm slides across the pad, especially when a device is inserted multiple times. Additionally, insertion of a semiconductor device into a socket can expose the device to stresses which can damage the circuitry on the device.

A semiconductor device which reduces or eliminates the problems described above with conventional semiconductor devices would be desirable.

SUMMARY OF THE INVENTION

The present invention provides a new semiconductor package and a method for forming the package that reduces problems associated with the packaging of conventional semiconductor devices, particularly problems resulting from wire bonding and encapsulation. One particularly preferred embodiment of the invention is a semiconductor device comprising at least one semiconductor wafer section having a plurality of electrically-conductive pads and at least one support which receives the wafer section. The device further comprises a socket for receiving the semiconductor wafer section, the socket having a plurality of electrically-conductive elements which are urged against and contact the electrically-conductive pads to provide a signal path from the wafer section.

Objects and advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

Figure 1:
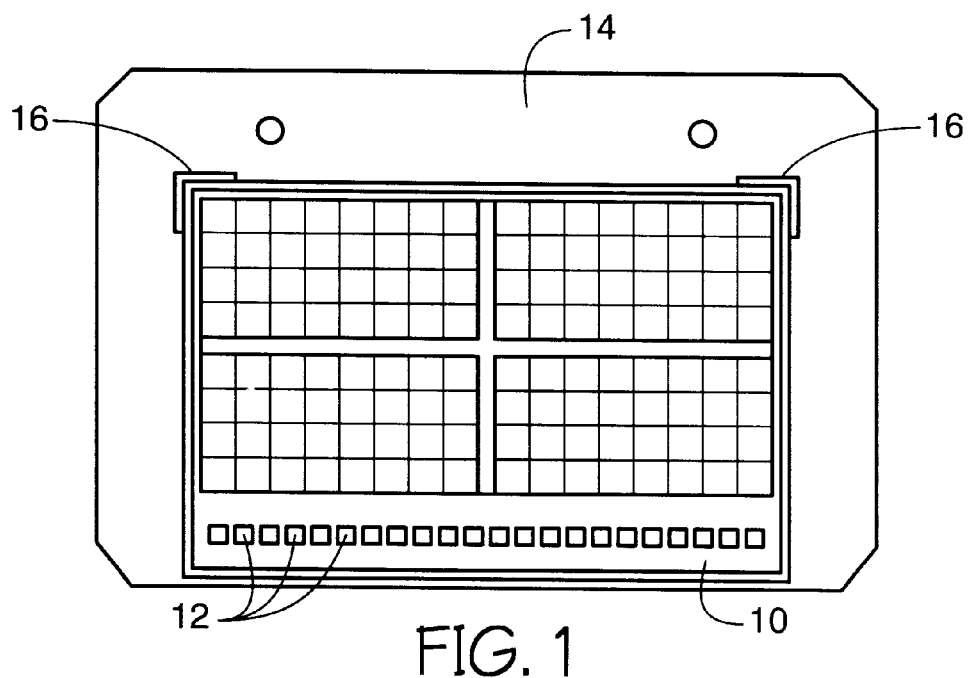
FIG. 1 is a front view depicting a semiconductor wafer section electrically and/or mechanically coupled with a support.
Figure 2:
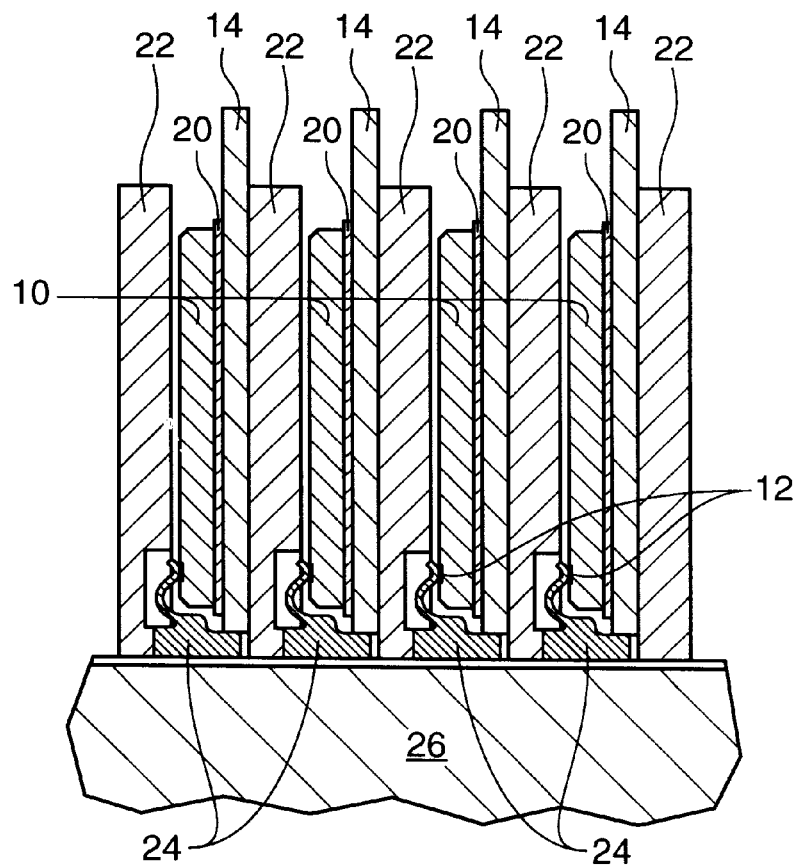
FIG. 2 is a side view depicting four semiconductor die each mechanically connected to a support and received by a socket.

A first embodiment of an inventive semiconductor device structure as depicted in FIGS. 1 and 2 comprises an unpackaged semiconductor wafer section such as a die 10 having a plurality of electrically-conductive pads 12 such as bond pads thereon arranged along one side of the die. The die itself can be a memory die, a microprocessor, a logic die or other types of die. The die 10 is attached to a support 14 using an adhesive 20. The support can comprise scribed or printed alignment indicia 16, part numbering, or other indicia as desired.

Figure 3:
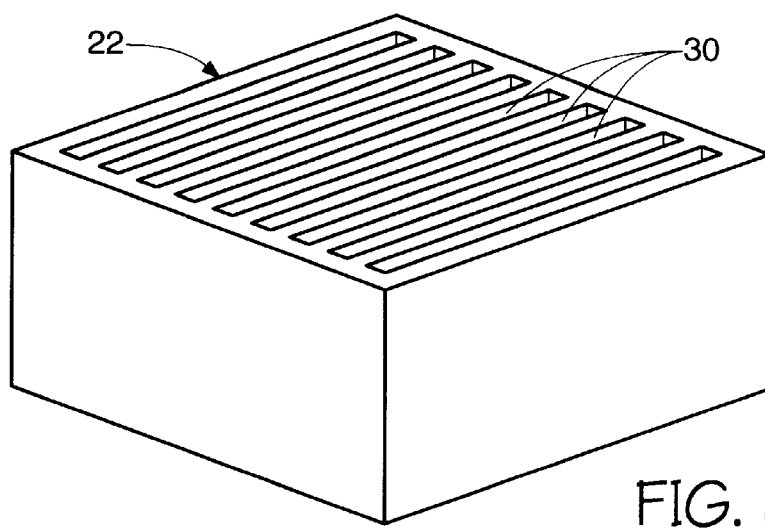
FIG. 3 is a three dimensional view of one embodiment of the socket of FIG. 2.

The instant embodiment further comprises a socket 22 as depicted in FIGS. 2–3 comprising at least one slot 30 which receives the die and support. Preferably, the socket comprises a plurality of slots and is adapted to receive a plurality of die and supports as depicted in FIG. 2. The socket itself 22 comprises a plurality of electrically-conductive elements 24 which are urged against and contact the pads 12 on the die 10 and provide a signal path from the die. As can be seen in FIG. 2, the elements 24 are force-coupled to the pads 12 by a spring-type action of the elements 24. Thus no adhesive is used to connect elements 24 with pads 12 in this embodiment which allows for simple replacement of malfunctioning die, although in various uses such an assembly having solder or other electrical connections may be useful.

As further depicted in FIG. 2, the back of the support 14 contacts a wall of the socket 22 and is held in place against the socket by the spring-type action of the plurality of electrically-conductive elements 24. In this embodiment it is preferable to provide a socket which is thermally conductive to draw heat away from the supports 14 which contact the wall of the socket 22. Socket materials including anodized aluminum, ceramic (aluminum nitride, etc.) or a filled epoxy molding compound with aluminum nitride filler would be sufficient.

Each conductive element 24 is electrically coupled with traces (not depicted) or other electrically-conductive pads on a printed circuit board (PCB) 26 or other substrate in a computer or other electronic device. In the structure of FIG. 2, elements 24 are surface mounted to pads on the PCB 26. The PCB pads are more particularly depicted as element 40 in FIG. 4.

The support 14 and the adhesive 20 can both comprise electrically-conductive or nonconductive materials, depending on the particular use of the invention, and the support is preferably manufactured from a rigid, thermally-conductive material which will support the die and will function as a heat sink to readily dissipate heat generated by the die. If a conductive adhesive and support are used the die can be electrically coupled with the support, and the support can be electrically coupled with a signal such as ground for the substrate through a trace in the socket or through contact with one or more of elements 24 to provide, for example, a ground plane. Materials which would function sufficiently as a support include copper, alloy 42, Kovar, ceramic, and various plastics. Adhesives used to electrically and/or mechanically connect the die with the support include epoxy, polyimide, and eutectic.

Figure 4:
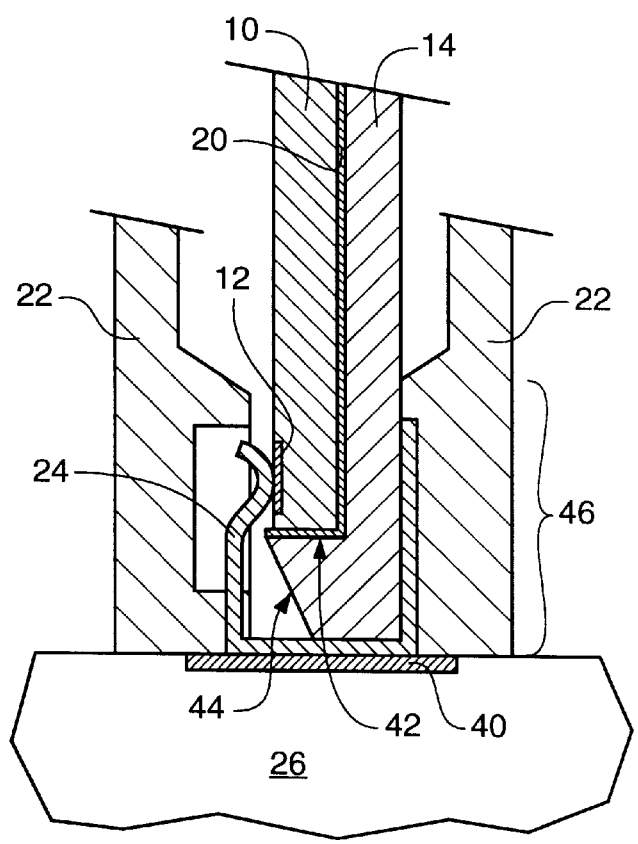
FIG. 4 is a side view cross section of a semiconductor wafer section received by a particular embodiment of a support, each of which is received by a socket.

FIG. 4 depicts an alternate embodiment of the invention. In this embodiment the die is protected at an edge along pads 12 by a shelf 42 which "contacts" one edge of the die (through adhesive 20). The adhesive can also be formed only on the back of the die so the shelf directly contacts the die. Protecting the edge of the die is particularly useful when the die is placed into the socket during assembly of the device to prevent damage to the edge of the die by contact with elements 24. Without such protection the edge of the die can crack or chip during insertion of the die into the socket thereby causing the die to malfunction. Additionally, an angled face 44 on the support 14 can ease insertion of the die 10 and support 14 into the socket 22. An face angled between about 15° and about 45° from vertical would be sufficient. FIG. 4 also depicts the pad 40 on the PCB 26 or other substrate to which the socket 22 is attached through its element 24.

FIG. 4 further depicts an assembly whereby the support 14 contacts the socket 22 only along a small portion of the socket, and the majority of the support remains free from contact with the socket. The area of contact is depicted as "46" in FIG. 4. If a material is used for the support and/or socket which is not sufficiently thermally conductive, it may improve the dissipation of heat generated by the die to allow an air flow around the die and support in the socket.

Figure 5:
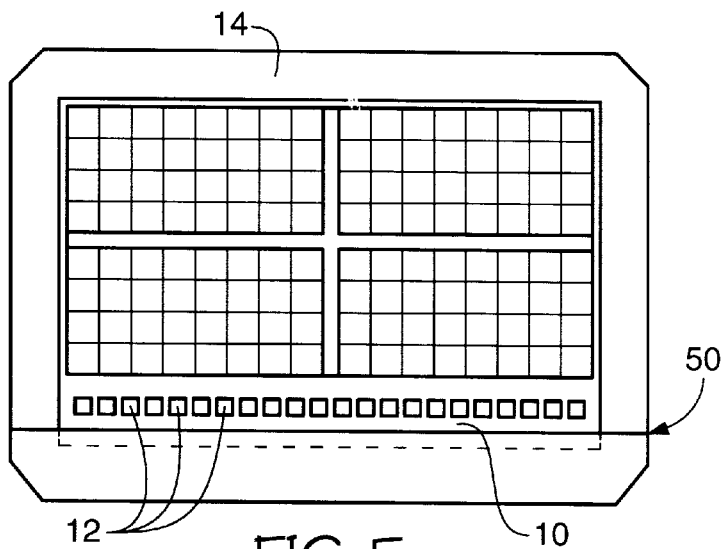
FIG. 5 is a front view.
Figure 6:
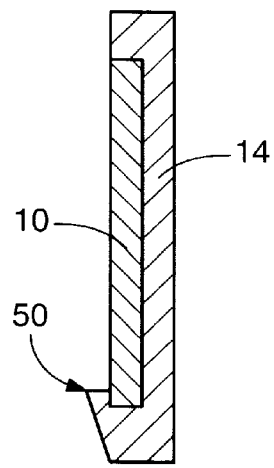
FIG. 6 is a side view, of a semiconductor wafer section received by a particular embodiment of a support.
Figure 7:
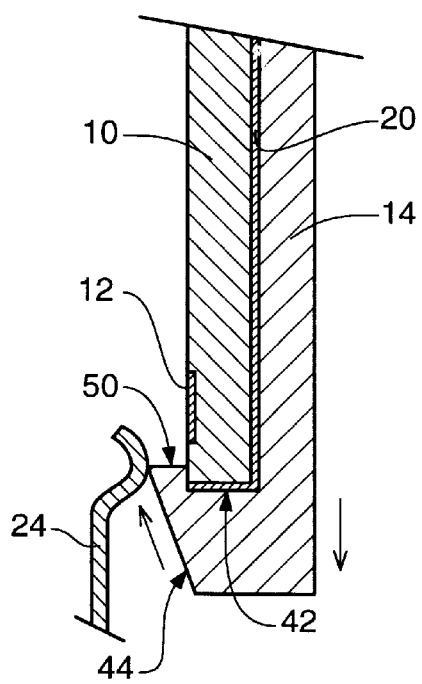
FIGS. 7 and 8 are side views depicting insertion of a die-support attachment into a socket, and particularly depicting the electrical connection of a conductive element of the socket with a bond pad on the wafer section.
Figure 8:
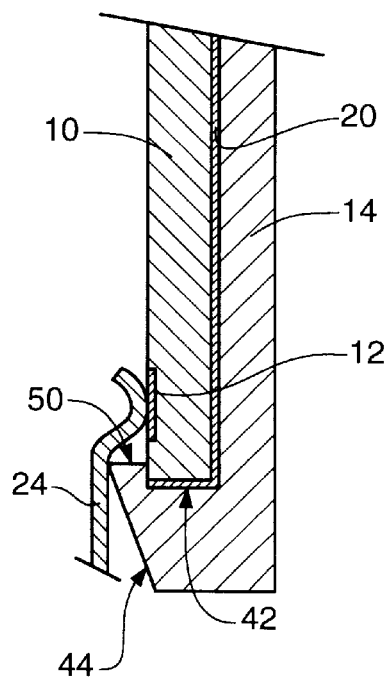

FIGS. 5 and 6 depict another embodiment of the invention. In this embodiment the die is protected at an edge along pads 12 by a lip 50 which overlaps the circuit side of the die (the die face having the pads 12 thereon). The support 14 of the embodiment of FIGS. 5–6 contacts both an edge of the die, similar to the support 14 of FIG. 4, and also contacts the circuit side of the die. The lip 50 in addition to protecting the edge of the die as the die is placed into the socket protects the circuit side of the die. Depending on the design of the lip 50, the lip can further allow the elements 24 to contact the pads 12 in a more vertical direction as can be seen in FIGS. 7–8. As the conductive element 24 slides over the lip, the lip follows the contour of element 24 until the element contacts the pad 12 in a more vertical direction thereby reducing or eliminating the sliding motion of element 24 across pad 12. This embodiment is especially useful to reduce damage to the pad resulting from multiple insertions of a die into a socket.

In an alternate embodiment a lip can be provided along any edge or along all four edges of the die for improved protection. It is further possible to provide a covering over a larger area of the circuit side of the die than that depicted in FIG. 7 if the pads 12 are exposed to allow contact therewith, or some other means of electrically contacting the pads 12 is provided.

In another embodiment the pads 12 on the die 10 can be bumped with solder or another conductive interconnect material to provide a means for coupling with pads conductive elements 24. After insertion of each die into the socket the assembly can be heated to flow the bumps. The pads 12 on the die will then be electrically coupled with elements 24 and mechanically coupled with the socket. Prior to bumping, any necessary plating material can be formed on pads 12 to provide the desired under-bump metalization (UBM) for the solder bumps.

A semiconductor assembly comprising the invention can be attached along with other devices to a printed circuit board, for example to a computer motherboard in a personal computer, a minicomputer, or a mainframe. The inventive device could further be useful in other electronic devices related to telecommunications, the automobile industry, semiconductor test and manufacturing equipment, consumer electronics, or virtually any consumer or industrial electronic equipment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, the wafer section can comprise a single die or a plurality of singularized or unsingularized die. The socket can receive various types of die in combination such as a combination of one or more microprocessors and one or more memory die. Further, the bond pads can be arranged in configurations other than along one edge as described herein. It is therefore contemplated that the appended claims will cover any such modifications or embodiments as fall within the true scope of the invention.

What is claimed is:

1. A method for forming a semiconductor module comprising:

providing at least one semiconductor wafer section having a plurality of electrically-conductive pads thereon;

providing a support which receives said wafer section;

providing a socket; and placing said wafer section into said socket such that a plurality of electrical interconnects on said socket contact said plurality of electrically-conductive pads on said wafer section.

2. The method of claim 1 further comprising:

attaching said wafer section to said support prior to placing said wafer section into said socket; and placing said support into said socket.

3. The method of claim 2 wherein said attachment of said wafer section to said support comprises electrically coupling said wafer section and said support.

4. The method of claim 1 wherein said providing said socket and providing said support comprise forming said socket and said support separately, and said method further comprises attaching said support and said socket prior to said placing said wafer section into said socket.

5. The method of claim 1 wherein said providing said support further comprises forming at least one indicium on said support.

6. The method of claim 1 wherein said providing said support further comprises forming a portion of said support having an angle of between about 15° and about 45° from vertical, and wherein said method further comprises:

sliding said angled portion of said support over said electrical interconnects such that said interconnects contact said angled portion; then contacting said interconnects and said electrically-conductive pads to provide a signal path from said electrically-conductive pads to said electrical interconnects.

7. The method of claim 1 further comprising attaching a noncircuit side of said wafer section to said support.

8. The method of claim 7 wherein said attachment of said noncircuit side of said wafer section to said support comprises attaching said noncircuit side of said wafer section to said support such that a circuit side of said wafer section remains free from contact with said support.

9. A method used to form a semiconductor device comprising:

providing at least one semiconductor wafer section having a plurality of electrically-conductive pads;

providing at least one support;

attaching said wafer section to said support such that said support contacts at least three sides of said wafer section;

providing a socket having a slot therein and further having a plurality of electrically-conductive elements; and inserting said semiconductor wafer section and said support into said slot in said socket to urge said electrically-conductive elements of said socket against said electrically-conductive pads to provide a signal path from said wafer section.

10. The method of claim 9 further comprising force coupling said conductive elements with said electrically-conductive pads to provide said signal path.

11. The method claim 9 wherein said insertion of said wafer section and said support into said slot in said socket comprises removably inserting each said wafer section such that each wafer section is individually removable from said socket.

12. The method of claim 9 further comprising:

providing at least a memory die and a microprocessor during said providing said at least one semiconductor wafer section, providing said socket having at least a first slot and a second slot therein during said providing said socket; and inserting said memory die into said first slot and said microprocessor into said second slot during said insertion of said semiconductor wafer section into said slot in said socket.

13. A method for forming an electronic device comprising:

providing a printed circuit board;

attaching a socket having a plurality of slots and a plurality of electrically-conductive elements to said printed circuit board such that an electrical path is provided between said printed circuit board and said socket;

providing a plurality of semiconductor wafer sections each having a plurality of electrically-conductive pads;

attaching each wafer section to a wafer section support; and inserting said each of said plurality of semiconductor wafer sections into one of said slots in said socket and contacting each said electrically-conductive pad with one of said electrically-conductive elements to provide an electrical path between said printed circuit board and each said semiconductor wafer section.

14. The method of claim 13 further comprising:

providing a plurality of electrically-conductive wafer section supports; and attaching each wafer section to one of said electrically-conductive wafer section supports.

15. The method of claim 14 further comprising providing an electrical connection to electrically couple each said die with at least one of said supports.

16. The method of claim 13 further comprising attaching each said wafer section to one of said supports with an adhesive.

17. The method of claim 13 wherein said attachment of each said wafer section to said wafer section support further comprises attaching a noncircuit side of each said wafer section to said support.

18. The method of claim 17 wherein said attachment of said noncircuit side of each said wafer section to said support further comprises attaching said noncircuit side of each said wafer section to said support such that a circuit side of said wafer section remains free from contact with said support.

19. A method for forming a semiconductor device comprising:

providing a socket having a plurality of slots therein;

providing a plurality of semiconductor wafer sections each having an edge and a back;

providing a plurality of wafer section supports each comprising a shelf;

contacting said edge of each said wafer section to one said shelf of one of said supports and attaching each said wafer section to one of said supports; and inserting each said wafer section into one of said slots of said socket.

20. The method of claim 19 further comprising providing a plurality of supports comprising a face angled between about 15° and about 45° from vertical which intersects said shelf during said providing said plurality of wafer section supports.

21. The method of claim 19 further comprising:

providing a plurality of supports comprising a lip during said providing said plurality of wafer section supports; and attaching each said wafer section to one of said supports such that said lip extends over a circuit side of said wafer section during said attachment of each said wafer section to one of said supports.

22. The method of claim 21 further comprising extending said lip over more than one edge of said circuit side of said wafer section during said attachment of each said wafer section to one of said supports.

23. The method of claim 19 further comprising:
during said providing said plurality of supports, providing a plurality of semiconductor wafer section supports having a back; and
during said attachment of each said wafer sections to one of said supports, attaching each said wafer section to one of said supports such that a majority of each said support at said back remains free from contact with said socket.

24. The semiconductor device of claim 19 further comprising:
during said providing said socket, providing a socket comprising a plurality of conductive elements;
during said providing said plurality of wafer sections, providing a plurality of wafer sections each comprising a plurality of bond pads; and
contacting each of said bond pads with one of said conductive elements during said insertion of each said wafer section into one of said slots of said socket.

25. The method of claim 24 further comprising:
bumping each said bond pad with a conductive interconnect material; and
contacting each said conductive element with said conductive interconnect material such that said conductive interconnect material electrically couples each said conductive element with one of said bond pads.

26. A method for forming a semiconductor device comprising:
providing at least one semiconductor wafer section having a circuit side with a plurality of electrically-conductive pads and a back side opposite said circuit side;
providing at least one support attached to said back side of said wafer section;
providing a socket adapted to receive both said semiconductor wafer section and said support attached to said wafer section, said socket comprising a plurality of electrically-conductive elements; and
inserting said semiconductor wafer section into said socket such that said electrically-conductive elements are urged against and contact said electrically-conductive pads to provide a signal path from said wafer section.

27. The method of claim 26 further comprising:
providing a socket having a wall which defines a slot in said socket; and
inserting both said semiconductor wafer section and said support into said slot defined by said wall during said insertion of said wafer section into said socket.

28. The semiconductor device of claim 26 further comprising attaching said support and said back of said wafer section by interposing an adhesive between said support and said an adhesive.

29. The method of claim 26 further comprising aligning said wafer section with said support using at least one alignment indicium on said support.

30. The method of claim 26 further comprising:
providing a socket having an angled socket face during said providing said socket; and
contacting said angled face with said support during said insertion of said wafer section into said socket.

31. A method for forming an electronic device comprising:
providing a printed circuit board;
attaching a socket having a plurality of slots and a plurality of electrically-conductive elements to said printed circuit board such that an electrical path is provided between said printed circuit board and said socket;
providing a plurality of semiconductor wafer sections each having a plurality of electrically-conductive pads, wherein said plurality of wafer sections comprises at least one memory die;
attaching each wafer section to a wafer section support; and
inserting said each of said plurality of semiconductor wafer sections into one of said slots in said socket and contacting each said electrically-conductive pad with one of said electrically-conductive elements to provide an electrical path between said printed circuit board and each said semiconductor wafer section.

32. The method of claim 31 further comprising providing at least one microprocessor during said providing said plurality of semiconductor wafer sections.

* * * * *